United States Patent [19]

Utsuda et al.

[11] Patent Number: 4,816,903
[45] Date of Patent: Mar. 28, 1989

[54] FILM CHECKING APPARATUS

[75] Inventors: Tetsuji Utsuda, Kawagoe; Takeo Onga, Tokyo; Taketo Sato, Tokorozawa; Teruo Suzuki, Kamifukuoka; Atsutoshi Mikami, Sakado; Hironobu Suda, Saitama; Hideo Sugimoto, Kodaira, all of Japan

[73] Assignee: Toppan Printing Co., Ltd., Tokyo, Japan

[21] Appl. No.: 908,181

[22] Filed: Sep. 17, 1986

[51] Int. Cl.$^4$ .......................... G03F 3/10; H04N 1/10
[52] U.S. Cl. ...................... 358/76; 358/280; 358/293
[58] Field of Search ............... 358/75, 76, 293, 294, 358/290, 280, 285

[56] References Cited

U.S. PATENT DOCUMENTS

| 4,007,326 | 2/1977 | Bernsen | 358/280 |
| 4,310,848 | 1/1982 | Carter et al. | 358/76 |
| 4,463,373 | 7/1984 | Mikami | 358/80 X |
| 4,464,677 | 8/1984 | Kuhn et al. | 358/75 |
| 4,495,491 | 1/1985 | Postl | 340/709 |
| 4,633,305 | 12/1986 | Nakayama | 358/76 X |
| 4,692,795 | 9/1987 | Nakao | 358/75 |

FOREIGN PATENT DOCUMENTS

| 57-108854 | 7/1982 | Japan | 358/76 |
| 58-070227 | 4/1983 | Japan | 358/76 |
| 58-070228 | 4/1983 | Japan | 358/76 |
| 58-102940 | 6/1983 | Japan | 358/76 |
| 58-102941 | 6/1983 | Japan | 358/76 |
| 652578 | 3/1979 | U.S.S.R. | 358/75 |

Primary Examiner—James J. Groody
Assistant Examiner—E. Anne Faris
Attorney, Agent, or Firm—Bacon & Thomas

[57] ABSTRACT

A film checking apparatus which picks up images of two master films placed on two transparent film tables, displays the obtained images thereof on a color monitor thereby allowing for checking of the master films. The apparatus aids the film checking by providing a device for comparing the master films, detecting for the differences and finally displaying the differences in a blinking manner. The apparatus also provides two light sources and a means to switching between the two light sources depending on whether the object is of transmissive-type or reflective-type.

14 Claims, 8 Drawing Sheets

FIG. 9A
(V. BLANK)

FIG. 9B
(GATE 182a)

FIG. 10A
(H. BLANK)

FIG. 10B
(TRANSFER)

FIG. 10C
(DISCHARGE)

FILM CHECKING APPARATUS

BACKGROUND OF THE INVENTION

The present invention relates to a checking apparatus for a master film etc. for a printing plate, and more particularly to a checking apparatus for determining whether or not a new film has errors, by comparing an uncorrected old film and the corrected new film.

In a conventional photomechanical process, various materials such as a film obtained by subjecting a color picture original film to color separation and a halftone process, a character original formed by a computer type setting device, a tint, and a lightproof mask film are adhered on a transparent film in accordance with a predetermined layout and in units of colors. The obtained films are multi-exposed and nega/posi or posi/nega inverted to obtain four master films of yellow (Y), magenta (M), cyan (C), and black (BK). In offset printing, the master films are placed on a pre-sensitized plate (PS plate) and the PS plate is exposed to form a printing plate. A proof is printed from the printing plate and subjected to client proofreading.

The master films must be checked and corrected before forming the printing plate and after the proofreading. For example, they must be checked to determine whether the error has been corrected, whether the color separation films are registered among the four color master films, and whether the tint and characters are arranged at predetermined designated positions. The master films may sometimes have to be formed again if there are many errors. Also, the first master films containing errors may be compared with revised master films. In this case, since the master films are formed manually and in complex procedures and the proofreading is a manual work, a portion of a first film other than the defective or designated portion can be erroneously corrected in a second film.

A hard copy of, e.g., a rough proof is conventionally prepared for the master film checking. However, it increases running costs such as material costs.

In order to solve this problem, one of the present inventors has proposed a checking apparatus described in "Previewing apparatus of flats " (U.S. Pat. No. 4,463,373). According to this apparatus, four master films are placed on a table. Optical images of light emitted from a light source under the table and transmitted through the master films are picked up at once. The obtained transmittance optical images of the master films of the respective colors are colored in corresponding colors, superposed on each other, and displayed at a single display screen. As a result, it can be checked on the display screen whether the master films of the respective colors are well-registered, and whether the tint and characters are arranged at predetermined designated position in the respective colors.

With the conventional apparatus, however, since the light source is provided only under the table, only a transmission-type object, i.e., a master film can be picked up. Thus, a reflection-type object, such as a blue print formed from a master film, a photocopy, a proof, and a block copy cannot be photographed. A printout sample, however, must be corrected several times during printing, and the printout sample must also be checked several times. Therefore, it is inconvenient if only a transmission-type object, e.g., a master film can be picked up.

Furthermore, according to the conventional apparatus, four images are merely superposed and displayed. Although the registration between the films can be checked, it is difficult to check whether a portion to be changed is corrected as designated.

A large space is required for the conventional apparatus since four color films of Y, M, C, and BK are held on a single plane. Since the relative positional precision among the four TV cameras must be high, the apparatus becomes expensive. Since the TV cameras correspond to Y, M, C, and BK, respectively, the master films must be placed at corresponding predetermined positions.

The white and black levels of the respective TV cameras must be adjusted to be the same. Conventionally, however, a level of an output signal of a TV camera is displayed on an oscilloscope and the white and black levels are adjusted while monitoring the oscilloscope screen. Therefore, adjustment operation is complex, and a space for an oscilloscope is needed.

SUMMARY OF THE INVENTION

It is an object of the present invention to provide a film checking apparatus which can check a reflection-type object such as a blue print, a photocopy, a proof, and a block copy, in addition to a transmission-type object such as a master film, and can check a master film in accordance with comparison between the reflection-type object and master film.

It is another object of the present invention to provide a film checking apparatus which allows easy checking as to whether a portion to be changed is corrected as designated.

It is still another object of the present invention to provide a small, low-price film checking apparatus.

It is still another object of the present invention to provide a film checking apparatus which can adjust the level of a TV camera with a simple operation.

A film checking apparatus according to the present invention comprises transparent tables for respectively placing a plurality of objects thereon, TV cameras for respectively picking up the objects on the tables, a monitor for superposing output images from the TV camera and for displaying the superposed image, a first light source, provided under the tables, for illuminating the objects, a second light source, provided above the tables, for illuminating the objects, and a switch for switching between the first and second light sources in accordance with whether the objects are transmission-type objects or reflection-type objects.

DETAILED DESCRIPTION OF THE PREFERRED EMBODIMENTS

A film checking apparatus according to an embodiment of the present invention will be described with reference to the accompanying drawings. In this embodiment, two objects are compared for checking. Examples of the object include a reflection-type object (a blue print, a photocopy, a proof, a printing plate, and a block copy, which are formed from a master film), as well as a transmission-type object (master film).

Figure 1:
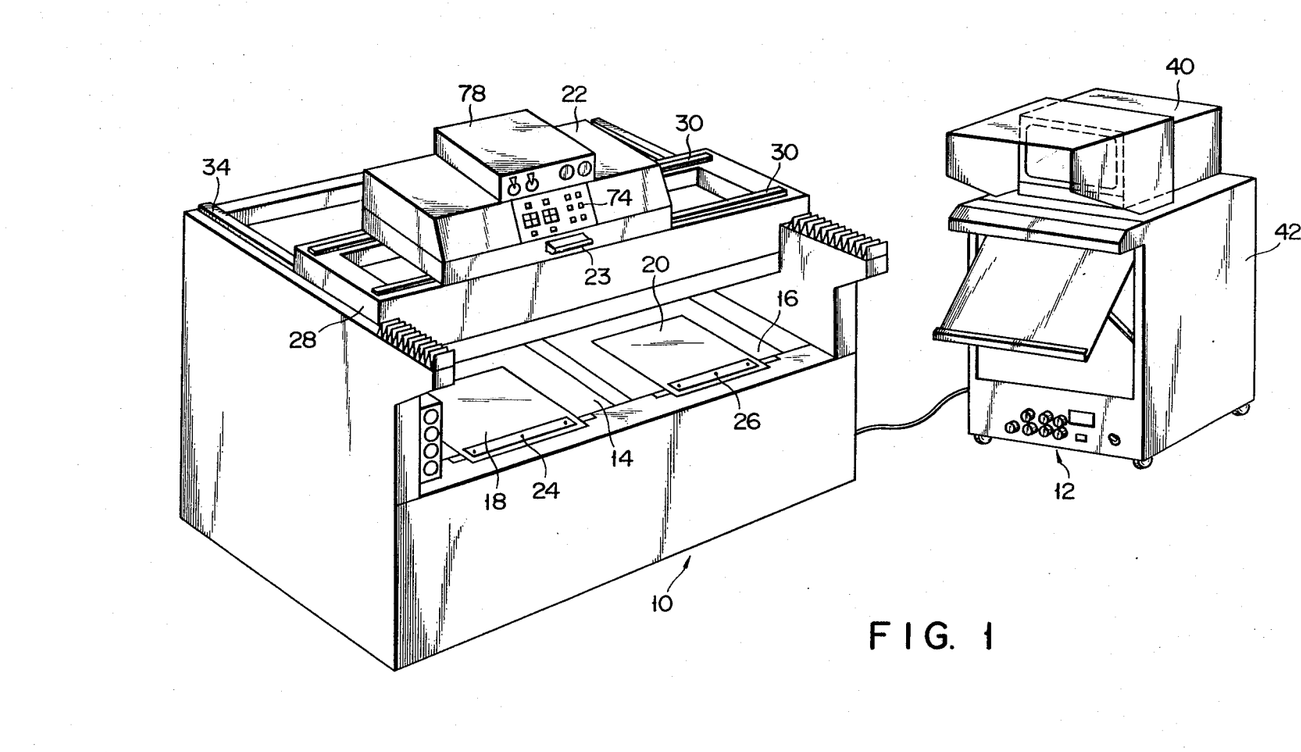
FIG. 1 is a perspective view of an outer appearance of a film checking apparatus according to an embodiment of the present invention.

FIG. 1 is a perspective view of an overall outer appearance of this embodiment. The apparatus of this embodiment comprises image pickup unit 10 and display unit 12.

Image pickup unit 10 has camera housing 22 incorporating TV cameras used to picking up two objects 18 and 20 placed on film tables 14 and 16, respectively. Film tables 14 and 16 are formed of a transparent material, such as a glass plate. Objects 18 and 20 are positioned on film tables 14 and 16 with register pins 24 and 26. As the positioning method, a punch system method, a method wherein reference lines are drawn on tables 14 and 16 and objects are aligned thereto, and so on are available. Since objects 18 and 20 placed on tables 14 and 16 may be curled, a means for holding them flat is also required. As this means, vacuum holes can be formed in tables 14 and 16, and the objects can be drawn by a vacuum pump through the vacuum holes. Alternatively, objects can be placed on tables 14 and 16 and thereafter a transparent glass plate can be placed thereon.

Camera housing 22 is placed on y-axis movable frame 28. X-axis rails 30 extending along an x-axis (to the right and left of the apparatus main body) are provided on frame 28. Housing 22 is moved on rails 30 along the x-axis. Y-axis rails 34 extending along a y-axis (forward and backward of the apparatus main body) are provided at an upper portion of the main body of unit 10. Frame 28 is provided on rails 34 and is moved along the y-axis. In this manner, housing 22 can be arbitrarily manually moved in the x- and y-directions by handle 23, and can pick up the images of the corresponding portions of objects 18 and 20 on tables 14 and 16.

Display unit 12 has color monitor 40 and electric circuit unit 42.

Figure 2:
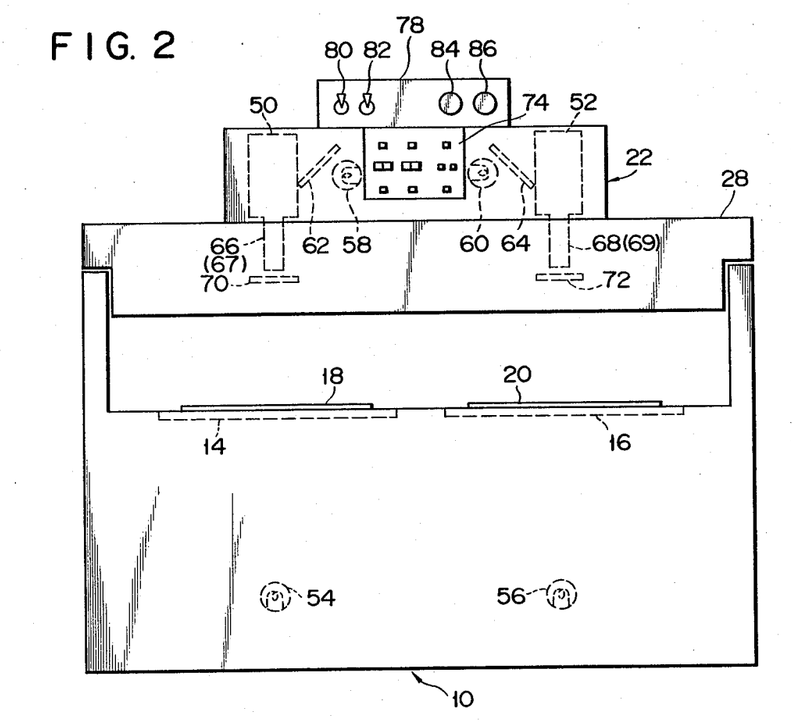
FIG. 2 is a sectional view of an internal configuration of a photographing unit shown in FIG. 1.

FIG. 2 is a sectional view of image pickup unit 10. TV cameras 50 and 52 are provided in housing 22. The relative positional relationship of cameras 50 and 52 can be adjusted. In this embodiment, two types of light sources are provided for image-picking up; one for irradiating a transmission-type object, and the other for irradiating a reflection-type object. Lamps 54 and 56 are provided under tables 14 and 16 as light sources for irradiating the transmission-type object. A DC stabilized power source (not shown) is connected to lamps 54 and 56.

Lamps 58 and 60 are provided in housing 22 as a light source for irradiating the reflection-type object. A DC stabilized power source (not shown) is connected to lamps 58 and 60. The light emitted by lamps 58 and 60 is reflected by mirrors 62 and 64 and irradiates objects 18 and 20 on tables 14 and 16. Light is reflected by mirrors 62 and 64 in order to increase the optical path length and hence to obtain light of uniform intensity. Thus, the housing 22 is made compact.

Cameras 50 and 52 have two interchangeable lenses 66 (67) and 68 (69), respectively. The magnifications of the pickup images can be switched between a low magnification (about ×2.5) and a high magnification (about ×13). Lenses 66 and 68 set the low magnification. Lenses 67 and 69 set the high magnification. Magnification is switched since an object must be enlarged when a halftone check is performed. Interchangeable lenses can be replaced by zoom lenses. Color filters 70 and 72 can be attached on the front faces of lenses 66 (67) and 68 (69) in order to pick up a bright object having a narrow density range, such as a blue print or printing plate. It is preferable that filters 70 and 72 are of complementary colors with the colors of the objects. For example, a Y-type filter is preferably attached on the front face of a TV camera photographing a blue print, and an R-type filter is preferably attached on the front face of a TV camera photographing a PS plate.

A centering mechanism for finely adjusting the scope of view in the x- and y-directions is provided to at least one of the TV cameras, e.g., TV camera 50, so that the position of camera 50 relative to camera 52 can be finely adjusted. This fine adjustment centering mechanism adjusts the relative position between cameras 50 and 52. The two master films can then be precisely superposed and displayed on color monitor 40.

Operation panel 74 and switch box 78 are provided on the front face and on housing 22, respectively. Switch box 78 has light source select switches 80 and 82, and shift switches 84 and 86. For cameras 50 and 52, switches 80 and 82 select a light source for irradiating a transmission-type object in a transmissive mode or a light source for irradiating a reflection-type object in a reflective mode. Switches 84 and 86 move one of cameras 50 and 52 in the x- and y-directions. When switches 84 and 86 are rotated, one of cameras 50 and 52 is shifted in the x- and y-directions to allow checking of a reflection-type object, unlike the above-described fine adjustment of the scope of view to be photographed. More specifically, a reflection-type object, such as a blue print, may be expanded or contracted during development and its size may thus become slightly different from the master film. As a result, even if two cameras are aligned at the centers of two objects, they can be misaligned at the peripheral portions of the objects when the master film and its blue print are compared. Thus, when two images are misaligned on the screen of the color monitor, switches 84 and 86 are operated to move one of the TV cameras. Checking is performed after the two images are correctly aligned with each other. Therefore, one of cameras 50 and 52 is moved only when at least one of the light sources selected by selection switches 80 and 82 is a light source for irradiating a reflection-type object. Cameras 50 and 52 are not moved when both of the light sources are light sources for a transmission-type object. The positions of cameras 50 and 52 are adjusted only by the fine adjustment mechanism described above.

It is desirable to finely adjust the magnification of the pickup image when the two objects have different sizes.

The magnification can be finely changed by changing the scan rate of the camera.

Figure 3:
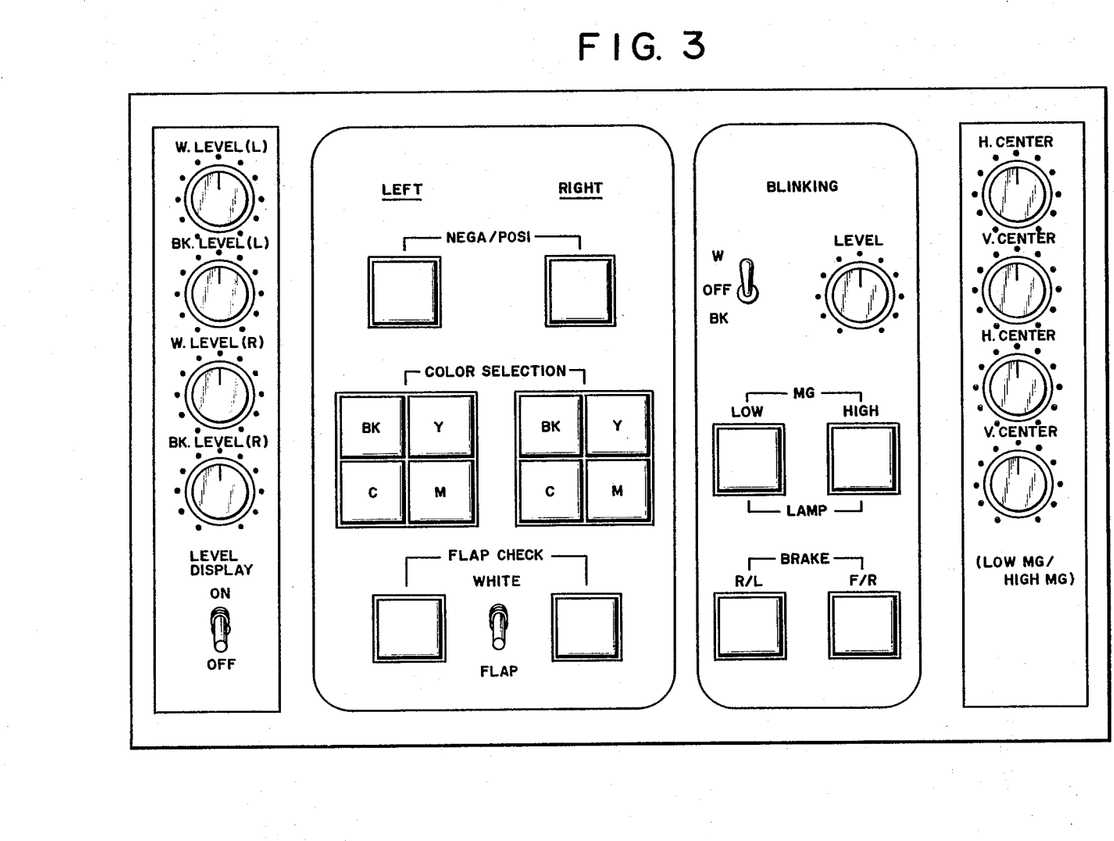
FIG. 3 is a plan view of an operation panel of the photographing unit shown in FIG. 1.

FIG. 3 is a plan view of operation panel 74. White- and black-level controls for the right and left cameras, and a switch for turning on/off the operation of the level display circuit shown in FIG. 4 are located at the leftmost portion of panel 74; nega/posi inversion switches, color selection switches, and flap check switches for the right and left cameras are located on the right side thereof; a white or black blinking designation switch, a blinking level switch, switches for changing pickup magnifications of the cameras between high and low magnifications, and brake switches are located on the right side thereof; and horizontal and vertical centering controls for both high and low magnifications are located at the rightmost portion of panel 74.

Note that the magnification change switches also serve as the light source switches. When the high or low magnification switch is depressed, the light source is turned on; when both high and low magnification switches are depressed, the light source is turned off. The low magnification corresponds to × 2.5 and the high magnification corresponds to × 13. The nega/posi switches invert the image of the object from nega to posi or vice versa in units of the right and left cameras. The color selection switches designate the color to be displayed on color monitor 40, i.e., to display images in Y, M, C, BK, R (when switches Y and M are simultaneously depressed), G (when switches Y and C are simultaneously depressed), and B (when switches C and M are simultaneously depressed), in units of the right and left cameras. The white background switch also serves as a flap check switch. The white background switch removes the images from the right and left cameras displayed on monitor 40 independently to display white. When flap is designated and one or both of the right and left flap check switches are depressed, the image from one camera is fixed while the image from the other camera is displayed alternately with white background, or the images of the both cameras are displayed alternately. The blinking designation switch blinks different portions of display images from the right and left cameras in white, black or any arbitrary color. The centering switches are electrical centering controls and can perform centering adjustment in low and high magnifications separately.

Figure 4:
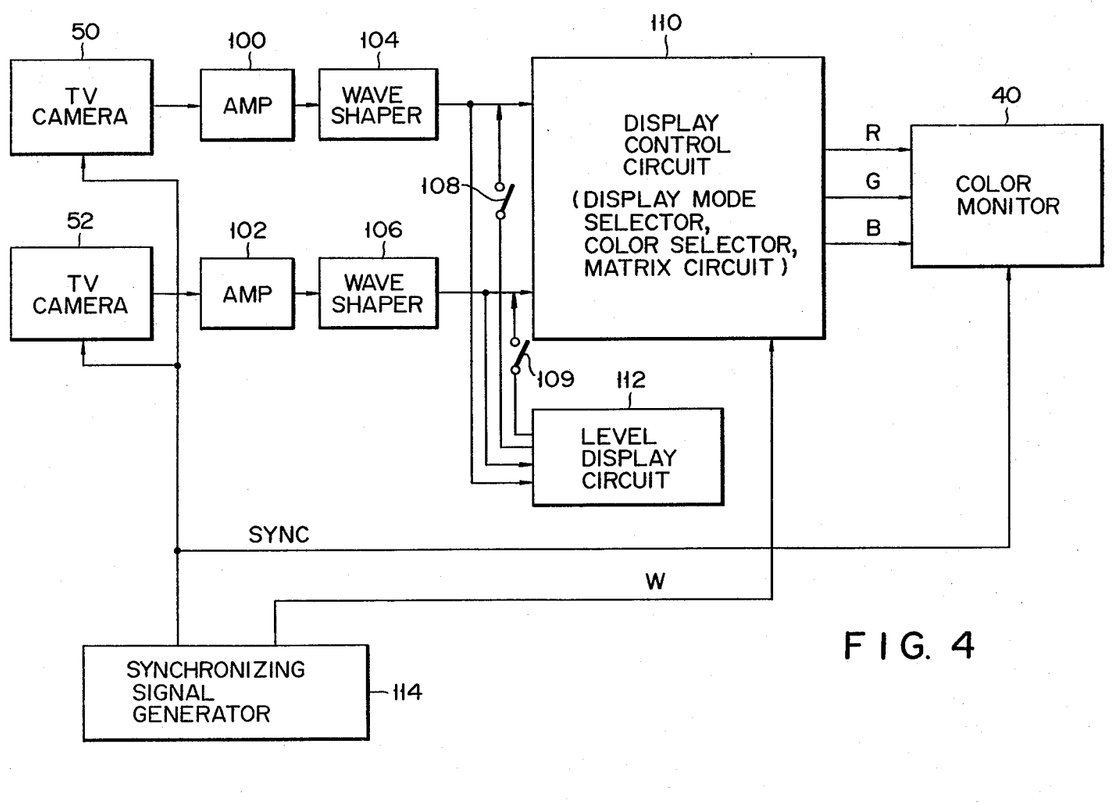
FIG. 4 is a circuit diagram of a display unit shown in FIG. 1.

FIG. 4 is a circuit diagram of electric circuit unit 42 in display unit 12. Image signals from TV cameras 50 and 52 are supplied to display control circuit 110 through amplifier 100 and wave shaper 104, and through amplifier 102 and wave shaper 106, respectively. Circuit 110 processes these image signals and supplies the same to color monitor 40 as R, G, and B color component signals. The signals output from wave shapers 104 and 106 are also supplied to level display circuit 112. Outputs from circuit 112 are added to outputs from wave shapers 104 and 106 through switches 108 and 109. Synchronizing signal generator 114 is provided to supply sync. signals to cameras 50 and 52 and to monitor 40. Generator 114 also generates a pseudo white signal supplied to circuit 110. The pseudo white signal is obtained by adjusting the blanking signal in the sync. signal to white level.

Figure 5:
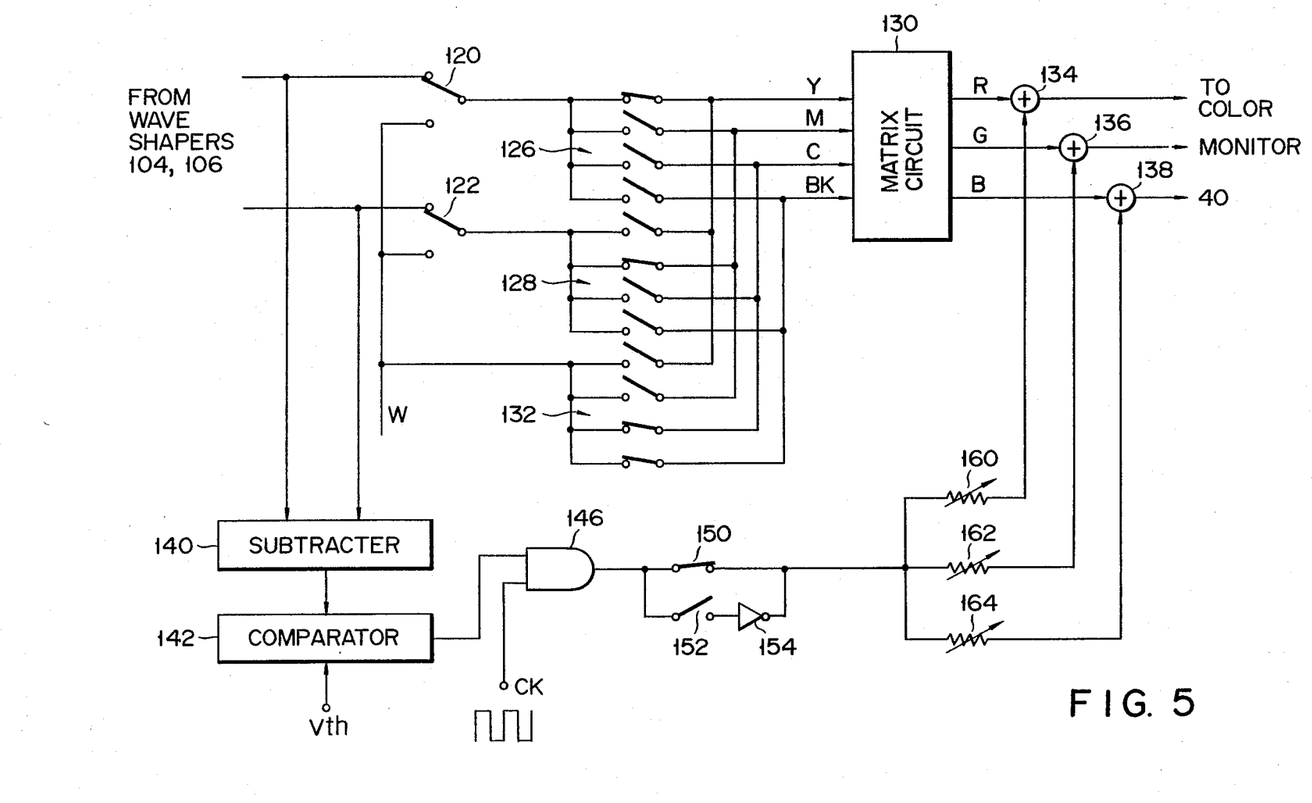
FIG. 5 is a circuit diagram of a display control circuit shown in FIG. 4.

FIG. 5 is a circuit diagram showing in detail display control circuit 110 shown in FIG. 4. The signals from wave shapers 104 and 106 are supplied to the first input terminals of flap check switches 120 and 122. The pseudo white signal is supplied to the second input terminals of switches 120 and 122. Output signals from switches 120 and 122 are supplied to matrix circuit 130 through color selection switches 126 and 128 each for coloring the image with Y, M, C, and BK. Matrix circuit 130 also receives the pseudo white signal through color selection switch 132 for Y, M, C, and BK. R, G, and B signals output from circuit 130 are supplied to color monitor 40 through adders 134, 136, and 138.

The signals from wave shapers 104 and 106 are also supplied to subtracter 140 to obtain a difference therebetween. A signal output from subtracter 140 is supplied to the first input terminal of comparator 142 and is compared with reference level signal Vth which is supplied to the second input terminal thereof. When the output signal of subtracter 140 is larger than signal Vth, comparator 142 supplies an output signal of level "1" to the first input terminal of AND gate 146. The second input terminal of AND gate 146 receives clock pulse CK which determines the blinking period. The period of pulse CK is set at 0.2 second.

The output signal of gate 146 is supplied to variable resistors 160, 162, and 164 through switch 150 or a combination of switch 152 and inverter 154. The signal supplied to the resistors is branched to three paths, supplied to mixers 134, 136, and 138 through variable resistors 160, 162, and 164, and added to R, G, and B signals output from circuit 130.

Figure 6:
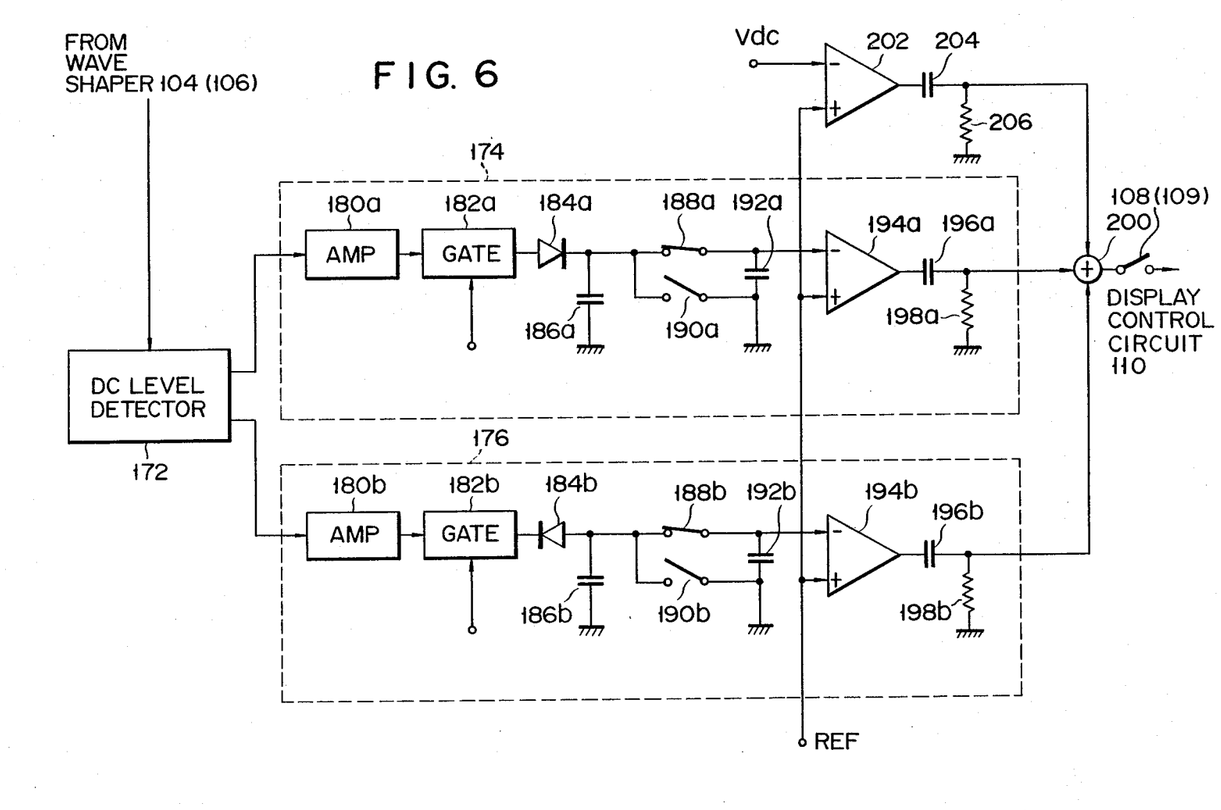
FIG. 6 is a circuit diagram of a level display circuit shown in FIG. 4.

The circuit 112 has two channels which respectively receives the outputs of wave shapers 104 and 106. FIG. 6 is a circuit diagram showing in detail one channel of the circuit 112. The signal from wave shaper 104 (or 106) is supplied to DC level detector 172. Black and white level signals are separated by detector 172 and are supplied to black and white level display circuits 176 and 174, respectively.

The white level signal supplied to circuit 174 is input to the anode of diode 184a through amplifier 180a and gate 182a. The cathode of diode 184a is grounded through capacitor 186a. The cathode of diode 184a is also connected to one end of each of switches 188a and 190a. The other end of each of switches 188a and 190a is connected to each other through capacitor 192a. The other end of switch 190a is also grounded. The other end of switch 188a is also connected to the (−) input terminal of comparator 194a. The (+) input terminal of comparator 194a receives a sawtooth reference signal synchronized with a horizontal blanking signal. The output signal of comparator 194a is supplied to the first input terminal of mixer 200 through a differentiator comprising capacitor 196a and resistor 198a.

Black level display circuit 176 has almost the same configuration as white level display circuit 174. The same reference numerals of circuit 176 denote the equivalent circuit element as in circuit 174, with suffix b instead of a. In circuit 176, diode 184b is connected in the opposite direction to diode 184a of circuit 174, and the output of gate 182b is connected to the cathode of diode 184b. The output of circuit 176 is supplied to the second input terminal of mixer 200.

DC signal Vdc as a reference white level is supplied to the (−) input terminal of comparator 202. The (+) input terminal of comparator 202 receives the sawtooth reference signal which is supplied to the (+) input terminals to comparators 194a and 194b. Mixer 200 also receives the output signal of comparator 202 through a differentiator comprising capacitor 204 and resistor 206 at its third input terminal. The output of mixer 200 is added to the output from wave shapers 104 or 106 through switches 108 or 109.

The operation of this embodiment will be described.

(1) Master Film Checking in Four-Color Printing

Two master films (positive films) are placed on film tables 14 and 16. Light sources for a transmissiontype object are selected with left and right cameras 50 and 52 by selection switches 80 and 82. The master films irradiated by lamps 54 and 56 from below are picked up by cameras 50 and 52. Color selection switches 126, 128, and 132 on operation panel 74 are operated so that the image signal from camera 50 is supplied to the Y input of matrix circuit 130, the image signal from camera 52 is supplied to the M input of circuit 130, and the pseudo white signal is supplied to the C and BK inputs of circuit 130. Then, a synthesized image having the image from camera 50 in Y and the image from camera 52 in M is displayed on monitor 40. When switches 126, 128, and 132 are switched so that the image signal from camera 50, the image signal from camera 52, and the pseudo white signal are supplied to the Y and M inputs, the BK input, and the C input, respectively, of circuit 130, a synthesized image comprising the image of camera 50 in R and the image of camera 52 in BK is displayed on color monitor 40.

As described above, according to the present invention, the master films respectively and selectively colored in Y, M, C, BK, R, G, or B can be displayed on monitor 40.

Checking of registration, tint, and character in units of colors is performed in the following manner. Y and M master films are placed on tables 14 and 16, respectively. Switches 126, 128, and 132 on panel 74 are operated so that the image signal from camera 50, the image signal from camera 52, and the pseudo white signal are supplied to Y,M, and C and BK inputs, respectively, of circuit 130. Then, a synthesized image comprising an image from camera 50 in Y and that from camera 52 in M is displayed on monitor 40. Subsequently, the Y and M master films are removed and C and BK master films are placed on tables 14 and 16, respectively. Switches 126, 128, and 132 on panel 74 are operated so that the image signal from camera 50, the image signal from camera 52, and the pseudo white signal are supplied to the C, BK, and Y and M inputs, respectively, of circuit 130. Then, a synthesized image comprising the image from camera 50 in C and the image from camera 52 in BK is displayed on monitor 40.

(2) Master Film Checking in single Color Printing Using Only a Specific Color

When a green master film is to be checked, switches 126, 128, and 132 of panel 74 are operated so that the image signal from camera 50 or 52 is simultaneously supplied to the Y and C inputs of circuit 130. Then, an image can be displayed in green on monitor 40.

(3) Comparative Check between First Master Film Before

Correction and Revised Master Film After Correction

First and revised master films are placed on tables 14 and 16. Switches 126, 128, and 132 on panel 74 are operated so that the image signal (revised master film) from camera 50, the image signal (first master film) from camera 52, and the pseudo white signal are supplied to the M, C, and Y and BK inputs of circuit 130. Then, a portion which is added to the revised film and a portion which is deleted in the revised film by correction are displayed in M and C, respectively, on monitor 40. This allows the operator to instantly compare the first and revised master films on monitor 40.

(4) Blinking Display

As described above, since the same sync. signals are supplied to cameras 50 and 52, the image signals therefrom are in phase. At this time, assume that the image signal from camera 50, the image signal from camera 52, and the pseudo white signal are supplied to the Y, M, and C and BK inputs, respectively, of circuit 130. Then, a synthesized image comprising the image from camera 50 in Y and the image from camera 52 in M is displayed on monitor 40. Meanwhile, the image signals from cameras 50 and 52 are supplied to subtracter 140 through wave shapers 104 and 106, respectively, and a difference therebetween is calculated. The difference signal is compared with reference level signal Vth by comparator 142. When the output signal of subtract 140 is larger than signal Vth, it is determined that a difference exists between the image signals from cameras 50 and 52 and an output signal of level "1" is supplied to the first input terminal of AND gate 146. The second input terminal of gate 146 receives a clock pulse having a period of 0.2 second.

Assume that switch 150 is closed and switch 152 is open. Then, the output of AND gate 146 is supplied through switch 150, branched to three paths through variable resistors 160, 162, and 164, and are supplied to mixers 134, 136, and 138 through variable resistors 160, 162, and 164 to add to the output R, G, and B signals from circuit 130, respectively. In this case, the output of AND gate 146 is at level "1" only when a difference exists between the image signals from two cameras 50 and 52. Therefore, when the output of gate 146 is added to the output R, G, and B signals from circuit 130 by adders 134, 136, and respectively, all the color signals are at maximum levels at the different portion, which is displayed in white on monitor 40. When the output signal of AND gate 146 is at level "0", the output R, G, and B signals from circuit 130 are unchanged.

As a result, when a difference exists between the images from two cameras, a white image and an ordinary image are alternately displayed with an interval of 0.2 second. In this manner, the difference between the first and revised master films is displayed by white level blinking to stand out, thereby facilitating checking of the first and revised master films.

Meanwhile, assume that switch 150 is opened and switch 152 is closed. Then, the output from AND gate 146 is branched to three paths through switch 152 and inverter 154, supplied to mixers 134, 136, and 138. In this case, the output from inverter 154 is at level "0" only when a difference exists between the images from two cameras, unlike the above case. Therefore, all the color signals are at the minimum levels at the different portion, which is displayed in black on monitor 40. When the output from inverter 154 is at level "0", however, the R, G, and B signals from circuit 130 are unchanged. As a result, a portion corresponding to the difference between the images from the two cameras is alternately displayed as a black image and a normal image at an interval of 0.2 second.

In this manner, the different portion between the two master films is displayed by black level blinking to stand out on the display screen.

The black or white level blinking can be switched by changing the blinking switch on panel 74 shown in FIG. 3 to the black or white side. When the blinking switch is turned off, both switches 150 and 152 (FIG. 5) are opened, and no blinking is performed.

When variable resistors 160, 162, and 164 are adjusted, the levels of the signals to be applied to mixers 134, 136, and 138 are changed, and blinking display in an arbitrary color can be performed on monitor 40 instead of black or white blinking described above. The resistances of resistors 160, 162, and 164 are adjusted by means of the blinking level control on panel 74 shown in FIG. 3.

Assume that the clock pulse supplied to AND gate 146 rises or falls at an arbitrarily time and blinking is thus started midway during a one-frame display. In this case, noise occurs on the screen of color monitor 40. In order to prevent this, the clock pulse is synchronized with a vertical blanking signal so that it rises during a vertical blanking period.

(5) Flap Check

Flap Check is conventionally performed by manual operation. Namely, an operation wherein two master films are superposed, the upper film is peeled off and returned, this is performed repeatedly in a flap manner in order to detect a difference between the two master films. In the present invention, this flap check is performed on the screen of monitor 40 by electrical signal processing.

More specifically, an image signal from at least one TV camera and a pseudo white signal are cyclically, alternately switched and supplied to matrix circuit 130. In other words, at least one of switches 120 and 122 is switched by a timing signal (having a period of about 0.5 to 2.0 second) from a timer circuit (not shown). Switching is performed during the vertical blanking period in order to prevent noise.

Assume that switch 120 is kept connected to the output side of wave shaper 104 and switch 122 is cyclically switched to the output side of wave shaper 106 and the psuedo white signal side. Then, an image from camera 50 is displayed on monitor 40 and the image from camera 52 is alternately superposed thereon and eliminated therefrom.

However, assume that switch 122 is kept connected to the output side of wave shaper 106 and switch 120 is cyclically switched to the output side of wave shaper 104 and the pseudo white signal side. Then, an image from camera 52 is displayed on monitor 40 and the image from camera 50 is alternately superposed thereon and eliminated therefrom.

Assume that switch 120 is cyclically switched to the output side of wave shaper 104 and the pseudo white signal side, and switch 122 is cyclically switched to the pseudo white signal side and the output side of wave shaper 106 in an opposite manner. Then, the images from cameras 50 and 52 are alternately displayed on monitor 40, thereby allowing flap check.

In this case, the images from the respective cameras can be colored arbitrarily in accordance with color selection switches 126, 128, and 132. Flap selection is performed by depressing the right flap switch, the left flap switch, and the both right and left flap switches on panel 74 shown in FIG. 3. The image displayed alternately with the image from one of the cameras need not be in white, but can be colored in pale blue so as to prevent fatigue of operator's eyes. In this case, the pale blue signal may be supplied to switches 120 and 122 in place of the pseudo white signal.

(6) Black and White Level Adjustment of Output Signal of TV Camera

Figure 7:
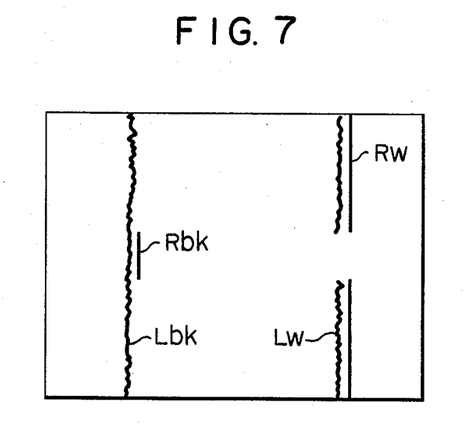
FIG. 7 is a view of an example of a screen of a color monitor when black and white levels of an output signal from a TV camera are adjusted.

In this embodiment, black and white reference lines Rbk and Rw and actual black and white level lines Lbk and Lw of the image signals from TV camera 50 or 52 are displayed on the screen of monitor 40, as shown in FIG. 7. The gain of amplifier 100 or 102 are adjusted to move lines Lbk and Lw to lines Rbk and Rw, thereby performing level adjustment of the image signal from the TV camera.

Figure 8A:
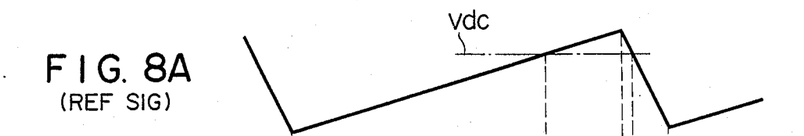
FIGS. 8A to 8F are waveform charts when the black and white levels of the output signal from the TV camera are adjusted.
Figure 8B:
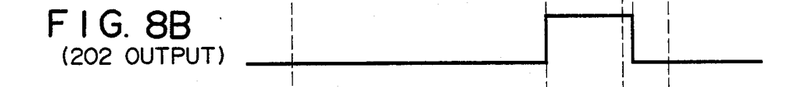
Figure 8C:
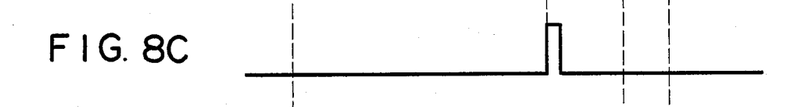

A signal Vdc of a DC level corresponding to the white level is supplied to the non-inverting terminal of comparator 202. The inverting terminal of comparator 202 receives the sawtooth reference voltage linearly changing from black to white level in 1-H period, as shown in FIG. 8A. The signal Vdc of the DC level is compared with the reference voltage. The DC level Vdc is indicated by a broken line in FIG. 8A. When the sawtooth reference signal exceeds the DC level Vdc, comparator 202 generates an output of level "1", as shown in FIG. 8B. This "1"-level output is differentiated by a differentiator comprising capacitor 204 and resistor 206. When the output of comparator 202 rises to level "1", a pulse is generated, as shown in FIG. 8C. White level reference line Rw is vertically displayed on the screen of monitor 40 by the differentiation pulse from capacitor 204 and resistor 206 at a transversely shifted position corresponding to the DC level Vdc.

Figure 9A:
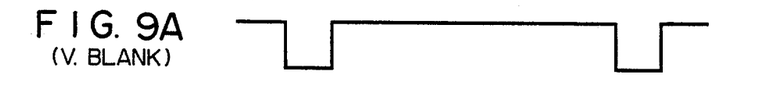
FIGS. 9A and 9B are waveform charts for explaining a gate signal for displaying a reference line for the black level.
Figure 9B:
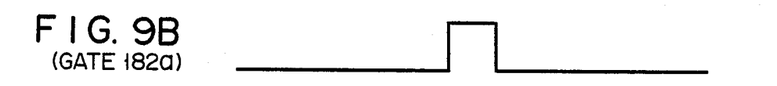

Black level reference line Rbk fits in the central disconnected portion of line Rw. Therefore, as shown in FIGS. 9A and 9B, a gate signal is supplied to gate 182a during a central portion of one field period, e.g., 10 H, and clears the white level reference pulse (differentiation pulse from capacitor 204 and resistor 206). During this period of time, a line Rbk is vertically displayed on the screen of monitor 40 at a transversely shifted position corresponding to the level of the gate signal to gate 182a. Therefore, when the level of the gate signal is set to match the black reference level, line Rbk is displayed to fit in the central portion of line Rw, as shown in FIG. 7.

Figure 8D:
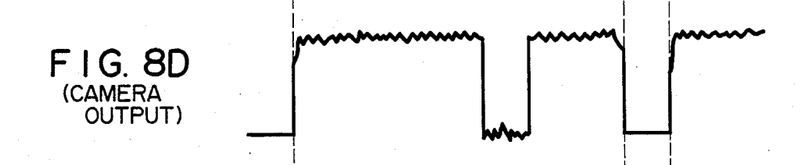

A case will be described wherein actual white and black level lines Lbk and Lw of the image signal of the TV camera is displayed. For this purpose, a test pattern including black and white portions is placed on the film table. Assume that an image signal as shown in FIG. 8D is input to DC level detector 172. Detector 172 sets a threshold value for the input signal. Positive and negative values with respect to the threshold value correspond to white and black levels, respectively.

Figure 10A:
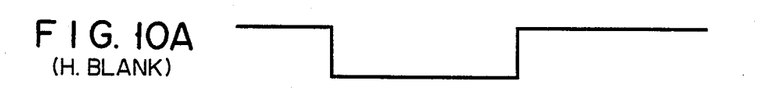
FIGS. 10A to 10C are waveform charts for explaining an operation for displaying the black and white level lines of the image signal from the TV camera.
Figure 10B:
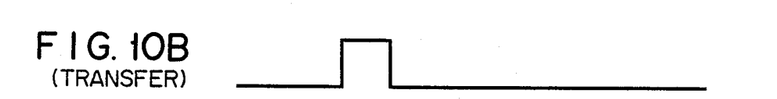
Figure 10C:
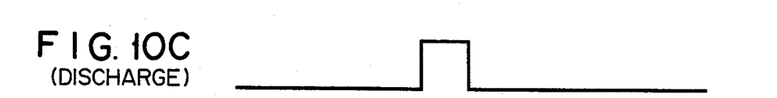

A white level image signal is supplied to the anode of diode 184a. This signal passes through gate 182a without being changed during a period excluding the period of the gate pulse shown in FIG. 9B, and is charged on capacitor 186a. Then, a voltage corresponding to the highest white level of the image signal from the TV camera is generated across the terminals of capacitor 186a. When switch 188a is closed by a charge transfer signal generated at the beginning of the horizontal blanking period, as shown in FIG. 10B, the signal is transferred to capacitor 192a. After this transfer, when switch 190a is closed by a discharge signal generated next to the charge transfer signal during the horizontal blanking period, as shown in FIG. 10C, the terminal voltage of capacitor 186a is discharged.

In this manner, a voltage corresponding to the highest white level of the image signal of every horizontal scanning line is applied across the terminals of capacitor 192a. This voltage is compared with the sawtooth reference signal shown in FIG. 8A by comparator 194a, and white level line Lw is displayed at a position corresponding to the terminal voltage of capacitor 192a. When the terminal voltage of capacitor 192a is increased, line Lw is shifted to the right; when the terminal voltage of capacitor 192a is decreased, line Lw is shifted to the left. Therefore, the position of actual white level line Lw is moved close to reference line Rw by adjusting the gain of amplifier 100 or 102 while monitoring the monitor 40, thereby performing level adjustment.

Figure 8E:
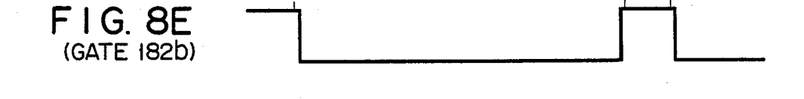
Figure 8F:
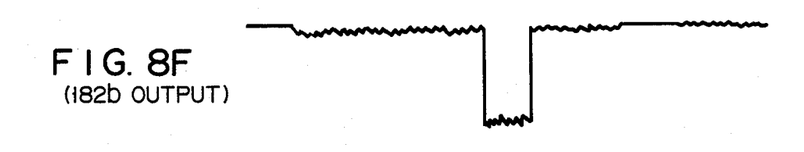

Similarly, a black level image signal flows into the cathode of diode 184b. In this case, the black level image signal takes the voltage during the blanking period as a reference. Therefore, when the black level image signal is to be displayed on the color monitor, the blanking period must be eliminated in order to detect the black level of the image signal within the effective screen portion. For this purpose, a gate signal having a pulse width and a pulse level slightly larger than the horizontal blanking period, as shown in FIG. 8E, is supplied to gate 182b. Upon reception of this gate signal, a signal obtained by adding the image signal and the gate signal is output from gate 182b, as shown in FIG. 8F. This sum signal is charged on capacitor 186b through diode 184b. Then, a voltage corresponding to the lowest black level image signal from the TV cameras is generated across the terminals of capacitor 186b. This voltage is transferred to capacitor 192b by closing switch 188b by a charge transfer signal generated at the beginning of the horizontal blanking period, as shown in FIG. 10B. After this transfer, switch 190b is closed by a discharge signal generated next to the charge transfer signal within the horizontal blanking period, as shown in FIG. 10C, in order to discharge the terminal voltage of capacitor 186b.

In this manner, a voltage corresponding to the lowest black level image signal of every horizontal scan line is applied across the terminals of capacitor 192b. This voltage is compared with the sawtooth reference signal, shown in FIG. 8A, by comparator 194b, and black level line Lbk is displayed at a position corresponding to the terminal voltage of capacitor 192b. When the terminal voltage of capacitor 192b is decreased, the position of line Lbk is shifted to the right; when the terminal voltage of capacitor 192b is decreased, the position of line Lbk is shifted to the left. Therefore, when the gain of amplifier 100 or 102 is adjusted to move actual black level line Lbk close to reference line Rbk while monitoring the screen, level adjustment can be performed.

As described above, according to the film checking apparatus of the present invention, a reflection-type object, such as a blue print, a photocopy, a proof, and a printing plate, as well as a transmission-type object, such as a master film, can be picked up and the master films can be checked by comparison with reflection-type object. It can be easily checked whether the registration between the respective master films is good, whether a character or tint is arranged as designated on the respective master films, and whether a portion to be changed is corrected as designated. In addition, an inexpensive, small film checking apparatus can be provided. Also, level adjustment of a TV camera is facilitated.

What is claimed is:

1. A film checking apparatus comprising: transparent table means for placing a plurality of objects thereon; light source means arranged to illuminate objects placed on said table means; means arranged to pick up optical images of objects placed on said table means and produce an output; means for processing and displaying said output from said pick up means including a means for comparing the optical images of the objects picked up by said pick up means with one another, and for detecting from a plurality of said optical images of the objects picked up by said pick up means portions of said optical images which are different from one another, and means for displaying said plurality of optical images of the objects in different colors and superposed one upon another, while displaying said detected different portions in a blinking manner.

2. An apparatus according to claim 1 wherein said light source means comprises: a first light source means arranged under said table means for illuminating said objects in a transmissive mode; a second light source means arranged above said table means for illuminating said objects in a reflective mode; and a switching means for selectively operating said first and second light source means.

3. An apparatus according to claim 3 wherein said table means comprises a plurality of tables equal in number to said plurality of objects; said pick up means comprises a plurality of cameras equal in number to said plurality of objects; and each of said first and second light source means comprises a plurality of lamps equal in number to said plurality of objects.

4. An apparatus according to claim 3 wherein said plurality of objects comprises two objects.

5. An apparatus according to claim 3 wherein said pick up means includes a means for adjusting the relative position of at least one camera among said plurality of cameras.

6. An apparatus according to claim 3 wherein said second light source means comprises a lamp and mirror positioned on a side of each pick up means and arranged to reflect light from said lamp to said table means.

7. An apparatus according to claim 3 wherein said pick up means comprises a means for adjusting the scan rate of said plurality of cameras, to thereby adjust magnification of said cameras.

8. An apparatus according to claim 3 wherein each of said plurality cameras comprises an interchangable lens to change magnification of said camera.

9. An apparatus according to claim 3 wherein said pick up means comprises means for adjusting the position of said plurality of cameras relative to said table means and for adjusting magnification of said plurality of cameras.

10. An apparatus according to claim 3 wherein said plurality of cameras are equipped with color filters which compliment the color of an object placed on said table means.

11. An apparatus according to claim 1 wherein said means for displaying said images includes means for alternatively displaying images of said plurality of objects within a single frame of said displaying means.

12. An apparatus according to claim 1 wherein means for displaying said images comprises means for displaying in a single frame said plurality of images of said objects in different colors and superposed, while alternately changing the color of at least one of said displayed images between an originally displayed color and one of white and a pale color.

13. An apparatus according to claim 1 wherein said means for displaying said images comprises: a means for displaying black and white level reference lines at predetermined positions on a display screen, a means for detecting black and white levels of said optical images picked up by said pick up means, a means for displaying black and white level lines at positions on said display screen corresponding to detected black and white levels of said optical images, and a means corresponding to detected black and white levels of said optical images, and a means for adjusting the black and white levels of optical images picked up by said pick up means.

14. An apparatus according to claim 1 wherein said means for displaying said images comprises a means to alternately change the color of said portions of said optical images displayed which are detected to be different between an originally displayed color and a different color.

* * * * *